United States Patent
Topacio et al.

(10) Patent No.: US 9,318,457 B2
(45) Date of Patent: Apr. 19, 2016

(54) METHODS OF FABRICATING SEMICONDUCTOR CHIP SOLDER STRUCTURES

(71) Applicants: Roden R. Topacio, Markham (CA); Neil McLellan, Austin, TX (US)

(72) Inventors: Roden R. Topacio, Markham (CA); Neil McLellan, Austin, TX (US)

(73) Assignees: ATI Technologies ULC, Markham (CA); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/818,621

(22) Filed: Aug. 5, 2015

(65) Prior Publication Data
US 2015/0340334 A1 Nov. 26, 2015

Related U.S. Application Data

(62) Division of application No. 13/221,517, filed on Aug. 30, 2011, now Pat. No. 9,142,520.

(51) Int. Cl.
*H01L 23/498* (2006.01)
*H01L 23/00* (2006.01)
*H01L 23/31* (2006.01)

(52) U.S. Cl.
CPC .......... *H01L 24/11* (2013.01); *H01L 23/49816* (2013.01); *H01L 23/49866* (2013.01); *H01L 24/05* (2013.01); *H01L 24/13* (2013.01); *H01L 23/3192* (2013.01); *H01L 24/03* (2013.01); *H01L 24/16* (2013.01); *H01L 24/81* (2013.01); *H01L 2224/0345* (2013.01); *H01L 2224/0346* (2013.01); *H01L 2224/0362* (2013.01); *H01L 2224/03614* (2013.01); *H01L 2224/03622* (2013.01); *H01L 2224/03912* (2013.01);

(Continued)

(58) Field of Classification Search
CPC .......... H01L 2924/00014; H01L 2224/13111; H01L 2924/00; H01L 2924/01047; H01L 2924/01029; H01L 2924/01082; H01L 2924/0105; H01L 2224/05552; H01L 2924/01079; H01L 2924/014
See application file for complete search history.

(56) References Cited

U.S. PATENT DOCUMENTS 4,034,469 A * 7/1977 Koopman .......... H01L 23/3736
174/16.3
5,162,257 A * 11/1992 Yung ...................... H01L 24/03
228/180.22

(Continued)

FOREIGN PATENT DOCUMENTS

EP 0726698 A2 8/1996
WO WO 0163668 A2 8/2001

OTHER PUBLICATIONS

PCT/US2011/066075 Partial International Search Report mailed May 2, 2013.

(Continued)

*Primary Examiner* — Jaehwan Oh
(74) *Attorney, Agent, or Firm* — Timothy M. Honeycutt (57) ABSTRACT

Various semiconductor chip solder bump and underbump metallization (UBM) structures and methods of making the same are disclosed. In one aspect, a method is provided that includes depositing a layer of a first metallic material on a semiconductor chip. The first layer has a first physical quantity. A layer of a second metallic material is deposited on the layer of the first metallic material. The second layer has a second physical quantity. The first and second layers are reflowed to form a solder structure with a desired ratio of the first metallic material to the second metallic material.

20 Claims, 11 Drawing Sheets

(52) U.S. Cl.
CPC .......... *H01L2224/0401* (2013.01); *H01L 2224/05018* (2013.01); *H01L 2224/05022* (2013.01); *H01L 2224/05027* (2013.01); *H01L 2224/05124* (2013.01); *H01L 2224/05147* (2013.01); *H01L 2224/05155* (2013.01); *H01L 2224/05166* (2013.01); *H01L 2224/05558* (2013.01); *H01L 2224/05567* (2013.01); *H01L 2224/05572* (2013.01); *H01L 2224/05639* (2013.01); *H01L 2224/05644* (2013.01); *H01L 2224/05647* (2013.01); *H01L 2224/05655* (2013.01); *H01L 2224/10126* (2013.01); *H01L 2224/115* (2013.01); *H01L 2224/1145* (2013.01); *H01L 2224/1146* (2013.01); *H01L 2224/1147* (2013.01); *H01L 2224/11502* (2013.01); *H01L 2224/11849* (2013.01); *H01L 2224/11912* (2013.01); *H01L 2224/13007* (2013.01); *H01L 2224/13022* (2013.01); *H01L 2224/13026* (2013.01); *H01L 2224/13111* (2013.01); *H01L 2224/16225* (2013.01); *H01L 2224/81193* (2013.01); *H01L 2224/81815* (2013.01); *H01L 2924/00014* (2013.01); *H01L 2924/0105* (2013.01); *H01L 2924/01029* (2013.01); *H01L 2924/0132* (2013.01); *H01L 2924/0133* (2013.01); *H01L 2924/01322* (2013.01); *H01L 2924/06* (2013.01)

(56) References Cited

U.S. PATENT DOCUMENTS

| | | | |
|---|---|---|---|
| 6,162,718 A * | 12/2000 | Boettcher | H01L 24/11 257/E21.508 |
| 6,596,621 B1 | 7/2003 | Copeland et al. | |
| 8,314,500 B2 * | 11/2012 | Belanger | H01L 24/03 257/753 |
| 2004/0121267 A1 * | 6/2004 | Jang | H01L 21/2885 430/315 |
| 2005/0054154 A1 * | 3/2005 | Huang | H01L 24/03 438/232 |
| 2005/0085062 A1 | 4/2005 | Kim | |
| 2005/0224966 A1 | 10/2005 | Fogel et al. | |
| 2006/0011482 A1 * | 1/2006 | Barkey | C25D 5/022 205/109 |
| 2007/0123020 A1 * | 5/2007 | Jungnickel | H01L 24/11 438/612 |
| 2007/0205520 A1 * | 9/2007 | Chou | H01L 23/3157 257/780 |
| 2008/0001241 A1 * | 1/2008 | Tuckerman | B81C 1/00301 257/434 |
| 2008/0002460 A1 * | 1/2008 | Tuckerman | B81C 1/00301 365/158 |
| 2008/0080113 A1 * | 4/2008 | Lin | H01L 21/76816 361/56 |
| 2008/0119056 A1 * | 5/2008 | Bailey | C09K 13/04 438/754 |
| 2008/0227237 A1 * | 9/2008 | Lin | H01L 24/11 438/106 |
| 2009/0218230 A1 | 9/2009 | Iijima | |
| 2010/0019347 A1 * | 1/2010 | McLellan | H01L 23/5223 257/532 |
| 2010/0165585 A1 * | 7/2010 | Lin | H01L 23/642 361/748 |
| 2011/0101521 A1 * | 5/2011 | Hwang | H01L 21/76885 257/737 |
| 2011/0101527 A1 * | 5/2011 | Cheng | H01L 24/11 257/738 |
| 2011/0241201 A1 * | 10/2011 | Wang | H01L 24/05 257/737 |
| 2012/0091576 A1 * | 4/2012 | Tsai | H01L 24/03 257/737 |
| 2013/0017681 A1 * | 1/2013 | Willeke | B23K 1/0016 438/614 |
| 2013/0020697 A1 * | 1/2013 | Deschenes | H01L 23/49811 257/737 |
| 2013/0049190 A1 * | 2/2013 | Topacio | H01L 24/05 257/737 |

OTHER PUBLICATIONS

Hirokazu Ezawa et al.; Eutectic Sn—Ag Solder Bump Process for ULSI Flip Chip Technology; IEEE Transactions on Electronics Packaging Manufacturing; vol. 24, No. 4; Oct. 2001; pp. 275-281.

* cited by examiner

METHODS OF FABRICATING SEMICONDUCTOR CHIP SOLDER STRUCTURES

This application is a divisional of prior application Ser. No. 13/221,517, filed Aug. 30, 2011.

BACKGROUND OF THE INVENTION

1. Field of the Invention

This invention relates generally to semiconductor processing, and more particularly to semiconductor chip solder bump structures and methods of making the same.

2. Description of the Related Art

Flip-chip mounting schemes have been used to mount semiconductor chips to circuit boards, such as semiconductor chip package substrates. In many conventional flip-chip variants, a plurality of solder joints are established between input/output (I/O) sites of a semiconductor chip and corresponding I/O sites of a circuit board. In one conventional process, a solder bump is metallurgically bonded to a given I/O site or pad of the semiconductor chip and a so-called pre-solder is metallurgically bonded to a corresponding I/O site of the circuit board. Thereafter the solder bump and the pre-solder are brought into proximity and subjected to a heating process that reflows one or both of the solder bump and the pre-solder to establish the requisite solder joint.

In one conventional process, solder bumps are fabricated on a semiconductor in a printing process. A stencil or mask with suitable openings leading to underlying conductor pads is formed. The openings are next filled with a solder paste and the stencil is then removed. A reflow is then performed to convert the solder paste into a solder bump. In another conventional process, solder bumps are fabricated in a plating process. A stencil or mask with suitable openings leading to underlying conductor pads is formed. Using a metal film, typically some blanket-deposited film, on the semiconductor chip as a plating bar, the openings are next filled by plating a solder mixture. The stencil is removed and the plated solder is reflowed to round out the bump.

A difficulty associated with conventional solder bump plating processes is composition control. For example, plating a tin-copper solder involves plating a pre-mixed solution of copper and tin. The solution will typically have a particular ratio of copper to tin. However, during the plating process, the mixture of the tin and copper that actually adheres to the plating bar may vary from the desired composition. While such deviated bumps will still conduct current, another issue may arise. The melting temperature of some types of solders are quite sensitive to solder composition. For example, some types of tin-copper solder can exhibit melting temperatures that significantly approach or exceed desired reflow temperatures if the copper content varies by 1% or so from the desired composition ratio. Structures in and around the solder bumps, such as a circuit board or components thereof, may not be able to withstand the unexpectedly high temperatures necessary to reflow such deviated bumps, and the solder may not even liquify.

The present invention is directed to overcoming or reducing the effects of one or more of the foregoing disadvantages.

SUMMARY OF EMBODIMENTS OF THE INVENTION

In accordance with one aspect of an embodiment of the present invention, a method is provided that includes depositing a layer of a first metallic material on a semiconductor chip. The first layer has a first physical quantity. A layer of a second metallic material is deposited on the layer of the first metallic material. The second layer has a second physical quantity. The first and second layers are reflowed to form a solder structure with a desired ratio of the first metallic material to the second metallic material.

In accordance with another aspect of an embodiment of the present invention, a method of coupling a semiconductor chip to a circuit board is provided. The method includes depositing a layer of a first metallic material on the semiconductor chip. The first layer has a first desired volume. A layer of a second metallic material is deposited on the layer of first metallic material. The second layer has a second desired volume. The first and second layers are reflowed to form a solder structure with a desired ratio of the first metallic material to the second metallic material. The solder structure is coupled to the circuit board.

In accordance with another aspect of an embodiment of the present invention, an apparatus is provided that includes a semiconductor chip that has a layer of a first metallic material. The first layer has a first quantity. A layer of a second metallic material is on the layer of first metallic material. The second layer has a second quantity. The first and second metallic materials are operable to form solder upon reflow and the first and second quantities are arranged to provide a desired ratio of the first metallic material to the second metallic material.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of methods of fabricating solder structures, such as solder bumps, for a semiconductor chip are described herein. One example includes depositing a layer of a first metallic material on a semiconductor chip where the first layer has a first desired volume. A layer of a second metallic material is deposited on the layer of the first metallic material. The second layer has a second desired volume. The first and second layers are reflowed to form a solder structure with a desired ratio of the first metallic material to the second metallic material. In this way, a solder bump of desired composition may be formed without resort to bulk plating of pre-combined solder constituents where variations in solder composition after plating can lead to higher than anticipated reflow temperatures, which might otherwise jeopardize temperature sensitive components, such as circuit board components, and even forestall solder liquification. Additional details will now be described.

Figure 1:
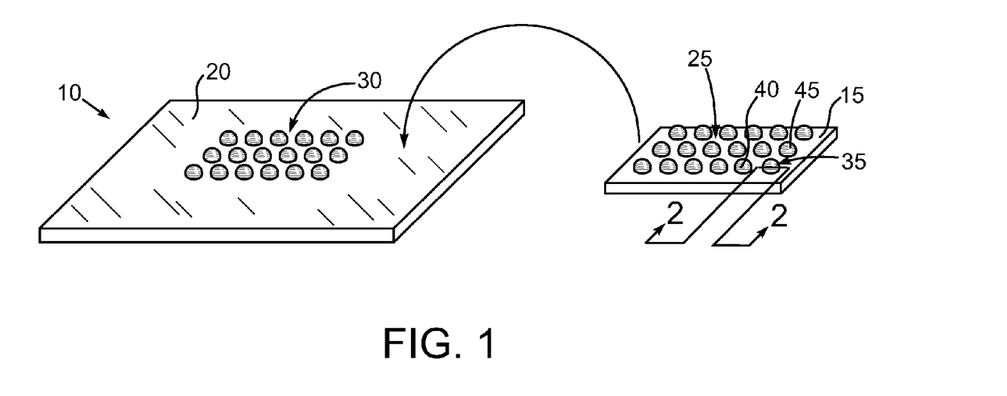
FIG. 1 is a pictorial view of an exemplary embodiment of a semiconductor chip device that includes a semiconductor chip mountable on a circuit board.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that includes a semiconductor chip 15 that may be mounted on a circuit board 20. In this illustrative embodiment, and to illustrate certain features of the semiconductor chip 15, the chip 15 is shown detached and flipped over from its mounting position on the circuit board 20. The semiconductor chip 15 includes multiple solder bumps 25, which are designed to metallurgically bond with the corresponding array of solder structures 30 on the circuit board 20 and form plural solder joints or other type of solder connections when the semiconductor chip 15 is mounted to the circuit board 20. Note that three of the solder bumps 25 are separately labeled 35, 40 and 45. The solder bump 35 will be used to illustrate additional features of the semiconductor chip 15 in conjunction with subsequent figures.

Figure 2:
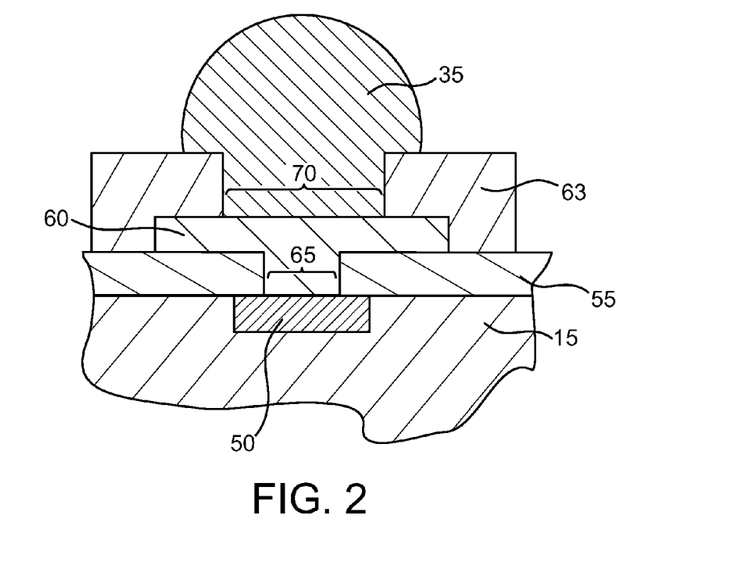
FIG. 2 is a sectional view of FIG. 1 taken at section 2-2.

FIG. 2 is a sectional view of FIG. 1 taken at section 2-2. Before turning to FIG. 2 in earnest, it should be noted that section 2-2 passes through a portion of the semiconductor chip 15 that includes the solder bump 35. The following discussion of the solder bump 35 will be illustrative of the other solder bumps 25 and related structures. Attention is now turned to FIG. 2. For simplicity of illustration, the full depth of the semiconductor chip 15 is not depicted and the features thereof are not drawn to scale. The solder bump 35 is designed to provide an electrical connection between the circuit board 20 and an underlying pad 50. The skilled artisan will appreciate that the pad 50 may be part of a topmost layer of interconnect metallization and may be connected to various other electrical structures both laterally and vertically that form up an interconnect system for the semiconductor chip 15. In addition, the skilled artisan will appreciate that somewhere within the confines of the semiconductor chip 15 an active device region with multitudes of integrated circuit elements such as transistors, resistors and others is positioned.

A variety of intervening structures are positioned between the solder bump 35 and the conductor pad 50. Proceeding from bottom to top, these intervening structures include a passivation structure 55, an under bump metallization (UBM) structure 60 and a polymer layer 63. The passivation structure 55 is designed to protect the conductor pad 50 from physical damage and contamination prior to the manufacture of the UBM structure 60 and attachment of the solder bump 35. Exemplary materials include silicon dioxide, silicon nitride, polyimide, laminates of these or the like.

The UBM 60 is designed to bond to the overlying solder bump 35 or other solder structure via an opening 65 in the passivation structure 55, to establish a conductive interface with an underlying conductor structure, in this case the conductor pad 50, and to bond as necessary with underlying or surrounding dielectrics, such as the passivation structure 55, all while providing a barrier to the diffusion of metals to or from the solder bump 35. Different illustrative UBM structures, such as the structure 60 and alternatives thereto, and methods of fabricating the same are disclosed. In one illustrative embodiment, the UBM structure 60 may be fabricated using techniques common for a printed bump. In an alternative to be described below, UBM structures may be fabricated using techniques more typically suited for a plated bump process. However, both alternatives are tailored for a plated bump process designed to provide advantageous solder composition control. In this illustrative embodiment, the UBM structure 60 may consist of a stack that includes an adhesion layer, a barrier layer and a solder-wettable layer. The adhesion layer is composed of a material(s) suitable to bond to both the underlying conductor pad 50 and to a portion of a passivation layer 55 that covers the conductor pad 50. Examples include titanium, titanium-tungsten or aluminum. The barrier layer is designed to inhibit the diffusion of metals relative to the solder bump 35. Solder can erode conductor pads, particularly those composed of copper. Typical adhesion layer materials include nickel or nickel-vanadium. The solder-wettable layer functions as the name implies. Typical materials include copper or gold.

The polymer layer 63 is positioned partially on the passivation structure 55 and partially on the UBM structure 60 and provided with a suitable opening 70 through which a portion of the solder bump 35 projects and makes metallurgical contact with the UBM structure 60. The polymer layer 63 for a given bump 35 may be patterned as an island as shown. The patterning may be well-known lithography where the polymer layer 63 includes photoactive compounds, or etch definition or even a lift-off process. Functionally speaking, the polymer film 63 is designed to provide a compliant protective film and thus may be composed of a variety of materials, such as polyimide, benzocyclobutene or the like.

The solder bump 35 and the other solder bumps 25 shown in FIG. 1 are preferably composed of lead-free solders, although lead-based solders could be used. An exemplary lead-based solder may have a composition at or near eutectic proportions, such as about 63% Sn and 37% Pb. Lead-free examples include tin-copper (about 99% Sn 1% Cu), tin-silver (about 97.3% Sn 2.7% Ag), tin-silver-copper (about 96.5% Sn 3% Ag 0.5% Cu) or the like. In a preferred embodiment, the solder bump 35 and the other solder bumps 25 shown in FIG. 1 may be composed of a SnCu solder consisting of about 0.7% Cu and about 99.3% Sn by mass. If lead-free solders are desired, then the constituents should be substantially lead-free, that is, contain no more than trace amounts of lead. As noted in the Background section hereof, plating a tin-copper solder bump with accurate control over alloy concentration in the plating solution is a relatively difficult task to perform. An increase of say 1% in copper content beyond a preferred range may increase the alloy melting temperature to 250° C. or above, which may exceed the tolerable thermal limits for the other portions of the semiconductor chip device 10, such as the circuit board 20 and the internal structures of the semiconductor chip 15, and forestall solder liquification. Exemplary processes are disclosed and described herein for plating processes to establish the solder bump 35 and the solder bumps 25 while maintaining relatively tight control over the copper content of the SnCu solder. Referring again briefly to FIG. 1, the solder structures 30 of the circuit board 20 may be composed of the same types of materials. Optionally, the solder structures 30 may be eliminated in favor of a single solder structure or a solder plus a conducting post arrangement.

An exemplary process for fabricating the bump 35 and UBM structure 60 will be described in conjunction with FIGS. 3-14. The process will focus on the UBM structure 60 and the solder bump 35, but will be illustrative of the other solder bumps 25 and related structures shown in FIG. 1. Attention is initially turned to FIG. 3, which depicts the semiconductor chip 15 following the conventional fabrication of a conductor pad 50 and the passivation structure 55. These steps and the steps that follow may be performed at the wafer level or on a die basis. The conductor pad 50 is electrically connected to another conductor structure (not shown) in and that may be part of the plural metallization layers in the semiconductor chip 15. The conductor pad 50 may be used as an input/output site for power, ground or signals or may be used as a dummy pad that is not electrically tied to other structures. The conductor structure 50 may form part of what may be multiple layers of conductor structures and interconnected by vias and surrounded by dielectric material layers (not shown). The conductor pad 50 may be composed of a variety of conductor materials, such as aluminum, copper, silver, gold, titanium, refractory metals, refractory metal compounds, alloys of these or the like. In lieu of a unitary structure, the conductor pad 50 may consist of a laminate of plural metal layers. However, the skilled artisan will appreciate that a great variety of conducting materials may be used for the conductor pad 50. Various well-known techniques for applying metallic materials may be used, such as physical vapor deposition, chemical vapor deposition, plating or the like. It should be understood that additional conductor structures could be used.

Figure 3:
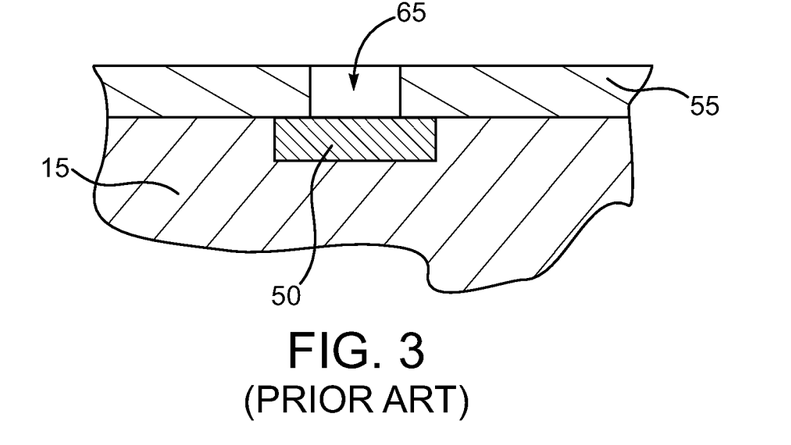
FIG. 3 is a sectional view of a small portion of a conventional semiconductor chip following conventional passivation structure etching.

The passivation structure 55 may consist of alternating layers of dielectric materials, such as silicon dioxide and silicon nitride, and may be formed by well-known chemical vapor deposition (CVD) and/or oxidation or oxidation techniques. A suitable lithography mask (not shown) may be formed on the passivation structure 55 and by well-known lithography steps patterned with a suitable opening in alignment with the conductor pad 50. Thereafter, one or more material removal steps may be performed in order to produce an opening 65 so that at least a portion of the conductor pad 50 is exposed. For example, the material removal steps may include one or more dry and/or wet etching processes suitable for the particular materials selected for the passivation structure 55. Following the material removal to yield the opening 65, the mask (not shown) may be stripped by ashing, solvent stripping or the like.

Figure 4:
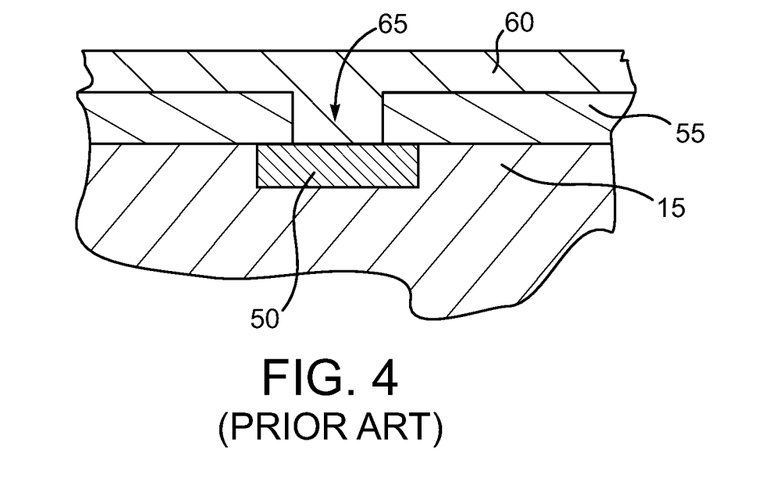
FIG. 4 is a sectional view like FIG. 3, but of a conventional underbump metallization structure fabrication.
Figure 5:
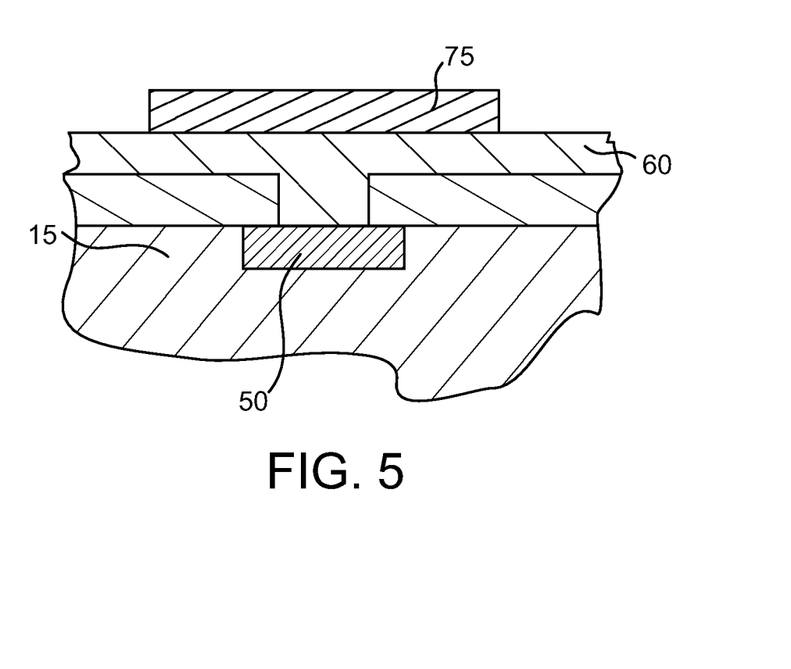
FIG. 5 is a sectional view like FIG. 4, but depicting masking of the underbump metallization structure.

The fabrication of the UBM structure 60 will now be described in conjunction with FIGS. 4-6. The skilled artisan will appreciate that a UBM is designed to bond to an overlying solder bump or other solder structure, to establish a conductive interface with an underlying conductor structure, in this case the conductor pad 50, to bond as necessary with underlying or surrounding dielectrics, such as the passivation structure 55, all while providing a barrier to the diffusion of solder constituents into underlying conductor structures and vice versa, which might otherwise degrade those conductor structures. In this illustrative embodiment a bump plating process may be used with a UBM process normally tailored for a printed bump. Thus, the UBM structure 60 may be formed in a conventional manner as a series of layers applied to the semiconductor chip 15 in succession, such as an adhesion layer of sputtered titanium or titanium-tungsten, followed by a sputtered nickel-vanadium layer, and capped with a sputtered solder-wettable layer of copper or gold. Optionally, plating could be used. Regardless of specific composition, conducting material fills the opening 65 to establish ohmic contact with the conductor pad 50.

The UBM structure 60 may be initially formed as a blanket that is subsequently patterned. As shown in FIG. 5, a mask 75 is formed on the UBM structure 60 and particularly at the location slated for eventual solder bump attachment and thus in alignment with the conductor pad 50. The mask 75 may be formed from positive tone resist, a hard mask or a non-contact mask. Patterning may be by well-known photolithography. Here, the mask 75 will serve as an etch mask to reduce the lateral extent of the UBM structure 60 to just that portion necessary for the eventual bump attachment to the semiconductor chip 15.

Figure 6:
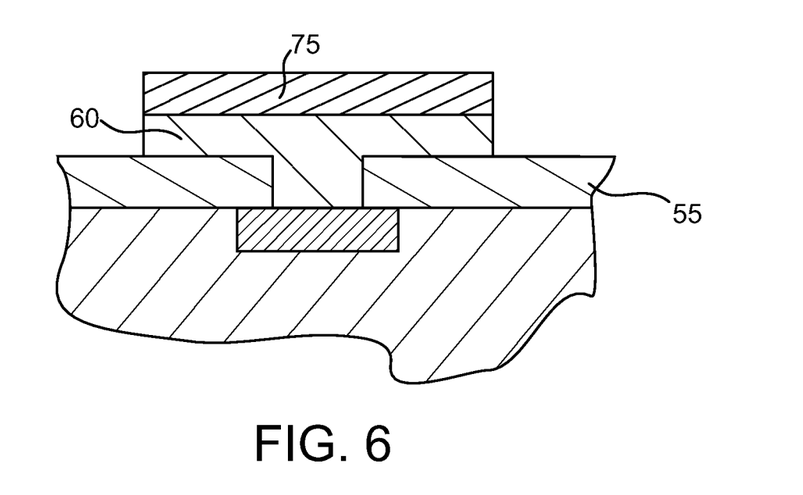
FIG. 6 is a sectional view like FIG. 5, but depicting patterning of the underbump metallization structure.

Thus, and as shown in FIG. 6, an etch process is performed to reduce the size of the UBM structure 60. Following the etch, the UBM structure 60 is patterned like an island. The etch chemistry and process suitable for etching the UBM structure 60 will depend upon the composition of the constituent layers. For example, a copper solder-wettable layer and nickel or nickel-vanadium layer may be etched using a hot phosphoric acid etch and a titanium adhesion layer may be etched using a HF etch. Although technically more complex, an island-like adhesion UBM structure 60 layer could be alternatively constructed by selective material addition, such as by lift-off processing. Following the etch, the mask 75 may be removed by ashing, solvent stripping or the like.

Figure 7:
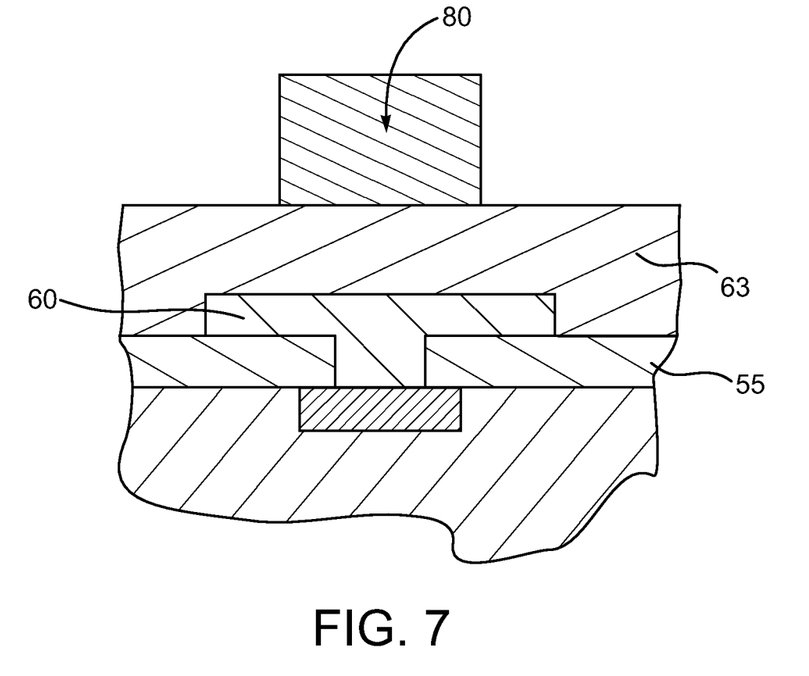
FIG. 7 is a sectional view like FIG. 6, but depicting polymer film application and masking.
Figure 8:
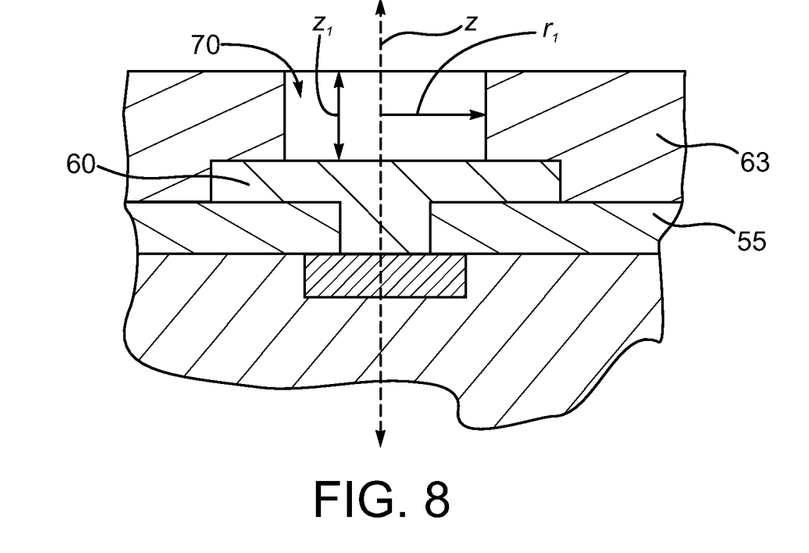
FIG. 8 is a sectional view like FIG. 7, but depicting formation of an opening in the polymer film.

Next and as shown in FIG. 7, the polymer layer 63 is applied to the UBM structure 60 and the exposed portions of the passivation structure 55. The polymer layer 63 is designed to provide a compliant protective layer and thus may be composed of a variety of materials, such as polyimide, benzocyclobutene or other insulating materials such as silicon nitride or the like and may be deposited by spin coating, CVD or other techniques. To establish the requisite opening 70 (see FIG. 2), the polymer layer 63 may be patterned lithographically. This may be done in a variety of ways. For example, the polymer layer 63 may be composed of polyimide infused with photoactive compounds to enable photolithographic patterning. A mask 80 may be formed on the polymer layer 63, and patterned in alignment with and of a somewhat smaller footprint than the UBM structure 60. The mask 80 may be formed from resist or hard mask materials. With the mask 80 in place, an exposure process is performed. The mask 80 may be next removed by ashing, solvent stripping or the like, and a developing process performed to yield the opening 70 in the polymer layer 63 exposing a portion of the UBM structure 60 as shown in FIG. 8. At this stage, the polymer layer 63 may require a curing bake process. For example, a polymer layer 63 composed of polyimide may be baked at about 380° C. for about 60 to 90 minutes. If the polymer layer 63 is not capable of material removal by way of exposure and developing, then a suitable lithography mask may be applied and an etch performed to yield the requisite opening 70.

Regardless of application and/or patterning technique, the opening 70 is advantageously formed with particular dimensions. Assume for the purposes of illustration only that the opening 70 is cylindrical. Accordingly, a cylindrical coordinate system with a z-axis centered in the opening 70 will be used herein to describe certain dimensions. The opening 70 is advantageously formed with a radius $r_1$ and a depth $z_1$ relative to the z-axis. The selection of values for $r_1$ and $z_1$ will be described in conjunction with other parameters below.

Figure 9:
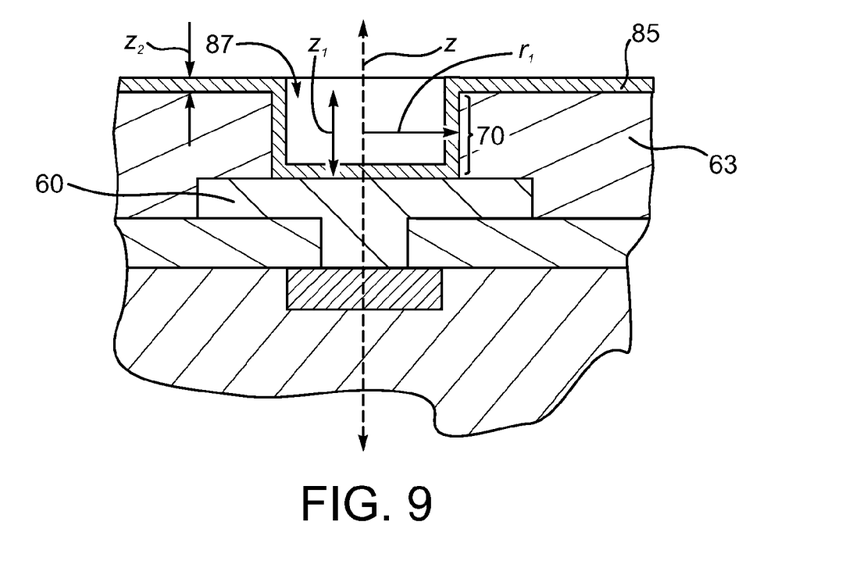
FIG. 9 is a sectional view like FIG. 8, but depicting deposition of a layer of a metallic material.

The fabrication of the solder bump 35 depicted in FIGS. 1 and 2 will now be described in conjunction with FIGS. 9, 10, 11, 12, 13 and 14. This illustrative process utilizes the deposition of successive layers of metallic material with desired volumes tailored to achieve a solder with a desired composition. As will be appreciated, volume is but one quantity measurement that can be used to achieve the desired composition. Other physical quantities could be employed to achieve desired results. Physical quantities of the layers may also include, but are not limited to, mass and moles of the materials. When mixed during a reflow, the metallic material layers mix to form a solder with the desired composition. Referring initially to FIG. 9, the first of these metallic layers, a metallic material layer 85, may be applied in blanket fashion with a thickness $z_2$ to coat the polymer layer 63 and the internal surfaces of the opening 70 in the polymer layer 63. Depending on the dimensions $z_1$ and $r_1$ of the opening 70 in the polymer layer 63 and the thickness $z_2$, the metallic layer 85 may be formed with an internal cavity 87. Exemplary materials for the metallic layer 85 include copper, silver or similar materials. The metallic layer 85 may be applied by sputter deposition, chemical vapor deposition or other techniques as desired. In an exemplary embodiment, copper may be sputter deposited. The copper will readily adhere to the underlying UBM structure 60. The purpose of the metallic layer 85 is to provide one of the constituents of the later-formed solder bump 35 (see FIGS. 1 and 2) and to serve as a plating bar for a subsequent plating process to plate another of the solder constituents. Since a technical goal of some of the disclosed embodiments is to establish a lead-free solder bump with a controllable constituent composition, the volume and therefore the mass of a portion of the metallic layer 85 that will be available to form solder at a later stage in processing must be controlled. Assume for the purposes of this illustration that a tin-copper solder bump is desired with a desired ratio or composition of about 0.7% copper and 99.3% tin by mass. Therefore the relationship between copper mass and tin mass $m_{cu}$ is given by:

$$m_{cu} = \frac{0.007 m_{sn}}{0.993} \tag{1}$$

The requisite or desired volume of copper $V_{cu}$ is given by:

$$V_{cu} = \frac{m_{cu}}{\rho_{cu}} \tag{2}$$

where $\rho_{cu}$ is the density of copper and the requisite or desired volume of tin $V_{sn}$ is given by:

$$V_{sn} = \frac{m_{sn}}{\rho_{sn}} \tag{3}$$

where $\rho_{sn}$ is the density of tin. Substituting, Equation (1) becomes:

$$V_{cu} = \frac{0.007 V_{sn} \rho_{sn}}{0.993 \rho_{cu}} \tag{4}$$

A variety of parameters may be varied to yield a desired or desired value of $V_{cu}$. Three of these are the dimensions $z_1$ and $r_1$ of the opening 70 in the polymer layer 63 and the thickness $z_2$ of the metallic layer 85. In combination with other variables to be described below, the thickness $z_2$ will yield a desired amount of the metallic layer 85 available for subsequent solder formation.

Figure 10:
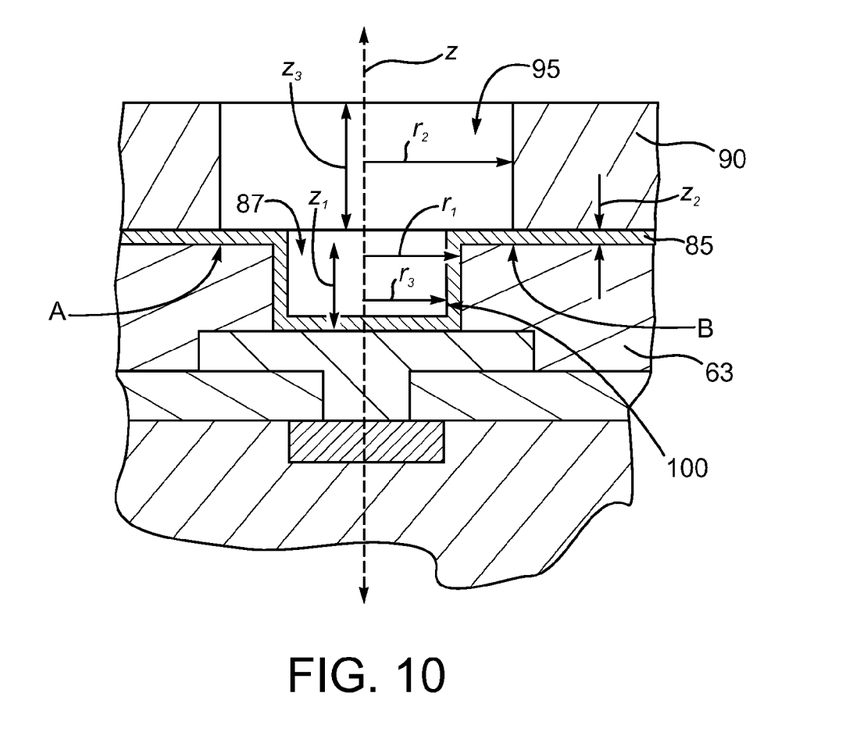
FIG. 10 is a sectional view like FIG. 9, but depicting masking of a portion of the metallic material layer.

Next, and as shown in FIG. 10, a mask 90 is applied to the metallic layer 85 and patterned with a suitable opening 95. The mask 90 may be a dry film or photoresist coating applied and patterned by well-known techniques. The opening 95 is advantageously fabricated with a radius $r_2$ and a depth $z_3$ relative to the z-axis. At this point it may be useful to define a quantity or a radius $r_3$ from the z-axis to an inner surface 100 of the metallic film 85. The radius $r_3$ is equal to $r_1$-$z_2$. The portion of the metallic film 85 between points A and B makes up the volume of the metallic film 85 that will interact with the later-plated tin to form a solder bump of desired copper-tin proportions. The opening 95 and the internal cavity 87 will eventually be filled with the plated tin. As such, the opening 95 and the internal cavity 87 form a vessel and define the volume $V_{sn}$ of plated tin, which will interact with the portion of the metallic film 85 between points A and B. Note the volume of tin will be given by:

$$v_{sn} = \pi r_2^2 z_3 + \pi r_2^3 z_1 \tag{5}$$

Figure 11:
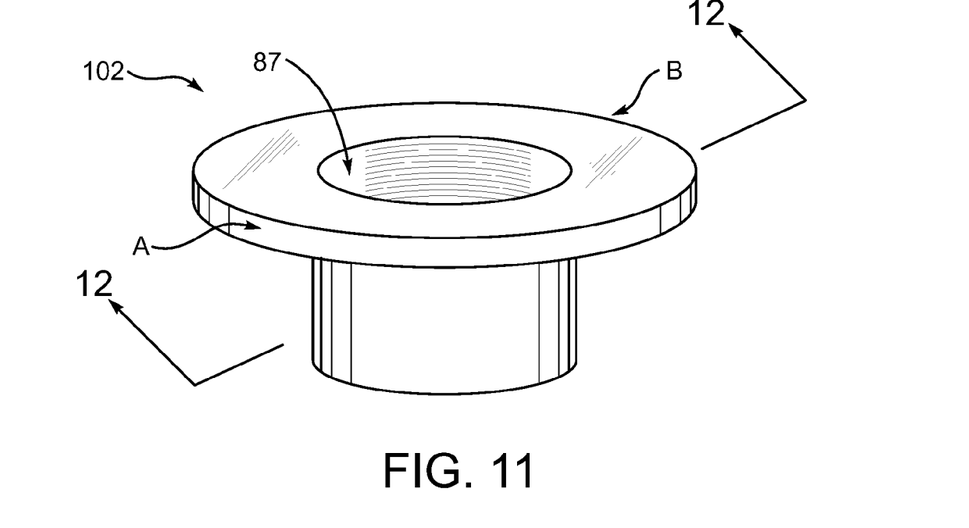
FIG. 11 is a pictorial view of the unmasked portion of the metallic material layer.
Figure 12:
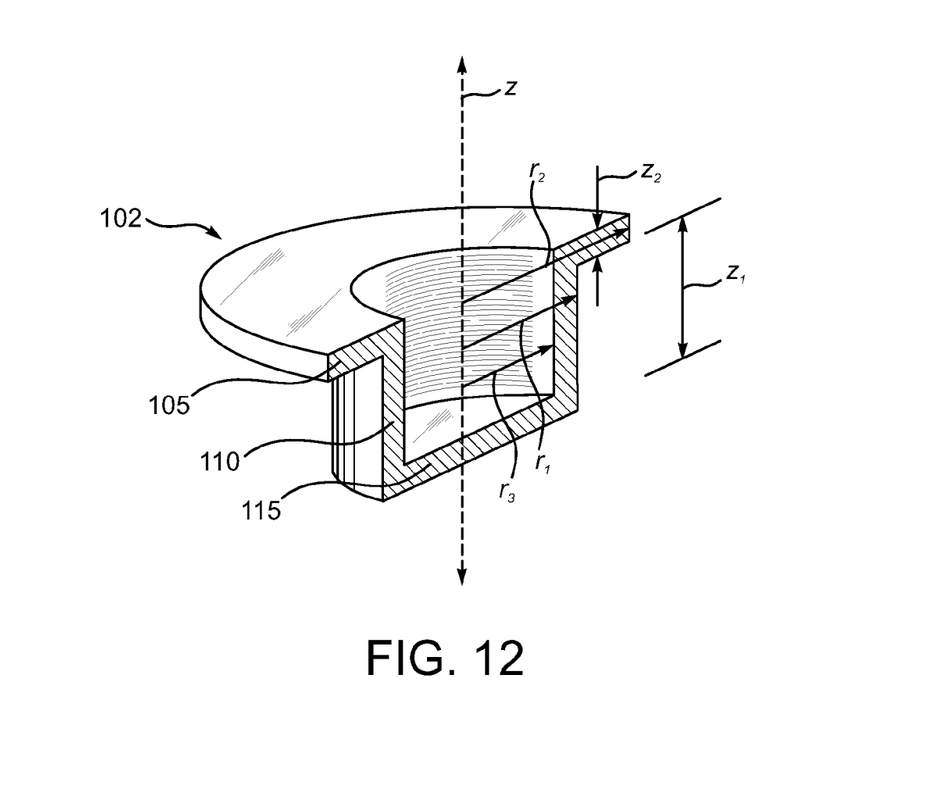
FIG. 12 is a sectional view of FIG. 11 taken at section 12-12.

To aid in the description of some exemplary mathematical relationships between some of the parameters in FIG. 10, the portion of the metallic film 85 from point A to point B is illustrated pictorially and labeled with element number 102 in FIG. 11. The portion 102 is depicted as it would appear if hypothetically removed from the semiconductor chip 15 in FIG. 10. Note the location of the cavity 87 and points A and B in FIG. 11. FIG. 12 is a sectional view of the portion 102 in FIG. 11 taken at section 12-12. Attention is now turned to FIG. 12. The portion 102 in this illustrative embodiment has a complex topography. To simplify the calculation of volume, the topography of the portion 102 may be sub-divided into a few integrally-connected structural features. For example, the portion 102 may consists of, from top down, a cylindrical shell 105, a cylindrical shell 110 and a cylinder 115. The cylindrical shell 105 has an inner radius $r_3$, an outer radius $r_2$ and a height $z_2$. The cylindrical shell 110 has an inner radius $r_3$, an outer radius $r_1$ and a height $z_2$. The cylinder 115 has a radius $r_3$ and thickness $z_2$. Accordingly, the total volume of the portion 102, which is $V_{cu}$ from Eq. (4), is given by the sum of volumes $V_{105}$, $V_{110}$ and $V_{115}$ of the cylindrical shells 105 and 110 and the cylinder 115, respectively. The volume $V_{105}$ is given by:

$$V_{105} = \pi z_2(r_2^2 - r_3^2) \tag{6}$$

the volume $V_{110}$ is given by:

$$V_{110} = \pi z_1 (r_1^2 - r_3^2) \tag{7}$$

and the volume $V_{115}$ is given by:

$$V_{115} = \pi r_3^2 z_2 \tag{8}$$

Thus, the total volume $V_{cu}$ is given by:

$$V_{cu} = \pi (z_2 (r_2^2 - r_3^3) + z_1 (r_1^2 - r_3^2) + r_3^2 z_2) \tag{9}$$

Substituting Eq. (4) into Eq. (9) yields:

$$V_{cu} = \pi (z_2 (r_2^2 - r_3^2) + z_1 (r_1^2 - r_3^2) + r_3^2 z_2) = \frac{0.007 V_{sn} \rho_{sn}}{0.993 \rho_{cu}} \tag{10}$$

and substituting Eq. (5) for $V_{sn}$ in Eq. (10) yields:

$$V_{cu} = \pi \left( z_2 (r_2^2 - r_3^2) + z_1 (r_1^2 - r_{13}^2) + r_3^2 z_2 = \frac{0.007 (\pi r_2^2 z_3 + \pi r_3^2 z_1) \rho_{sn}}{0.993 \rho_{cu}} \right) \tag{11}$$

Referring to FIGS. 10 and 12, the values of $z_1$, $r_1$, $r_2$ and $z_3$ will be generally dictated by other design considerations, such as minimum bump spacing, desired bump height and polymer layer 63 thickness (see FIG. 9), and thus be known in advance. Therefore, the requisite thickness $z_2$ of the metallic layer 85 can be readily ascertained using Eq. 11 for a given solder composition. Of course, the foregoing example assumes cylindrical openings in various films and corresponding cylindrical shapes for the relevant portion of the metallic layer 85. However, the skilled artisan will appreciate that other footprints and solder compositions may be used and Eqs. (1)-(11) modified and/or augmented accordingly for the different geometries, densities and relevant proportions of the solder constituents.

Figure 13:
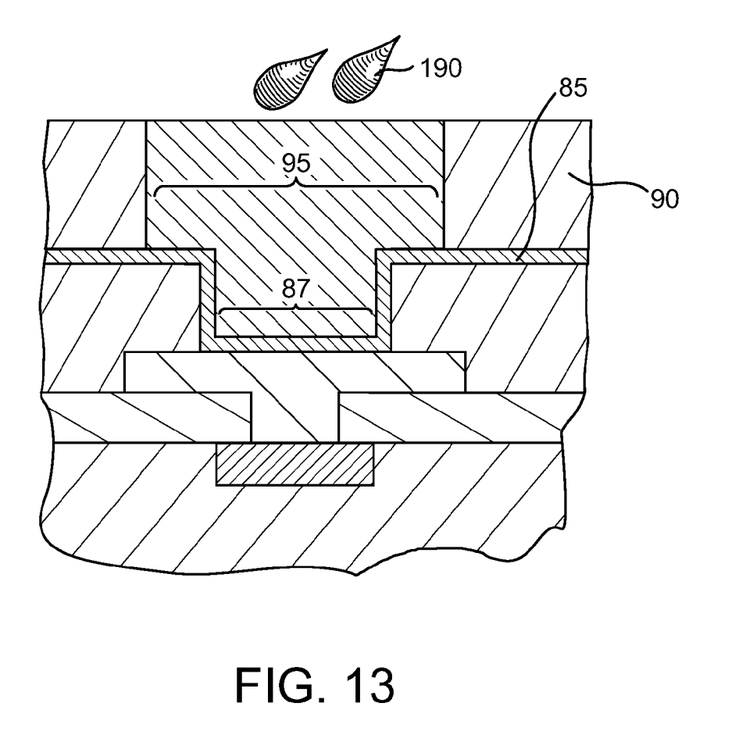
FIG. 13 is a sectional view like FIG. 10, but depicting exemplary deposition of another metallic material on the first metallic material.
Figure 14:
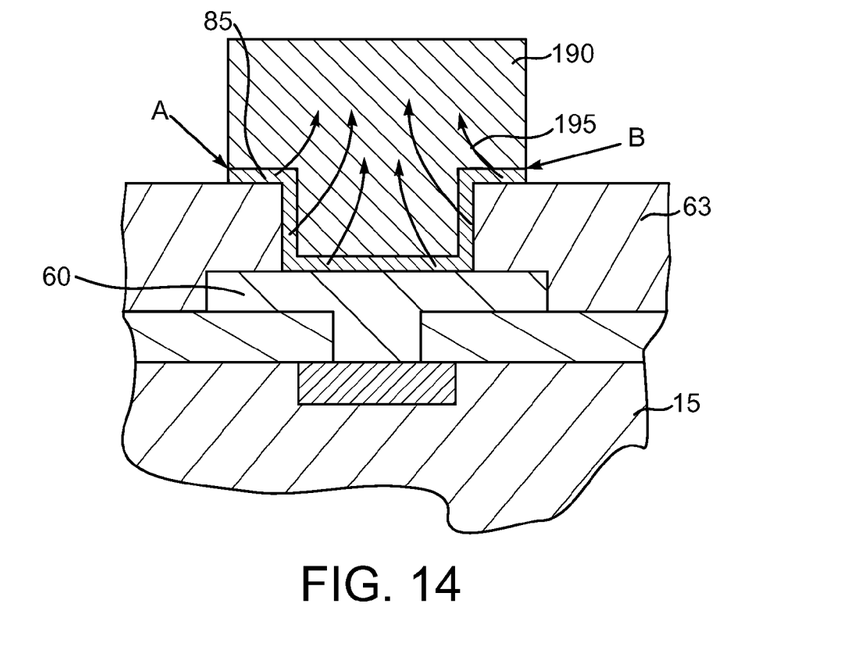
FIG. 14 is a sectional view like FIG. 13, but depicting exemplary reflow of the two metallic material layers to form a solder structure.
Figure 15:
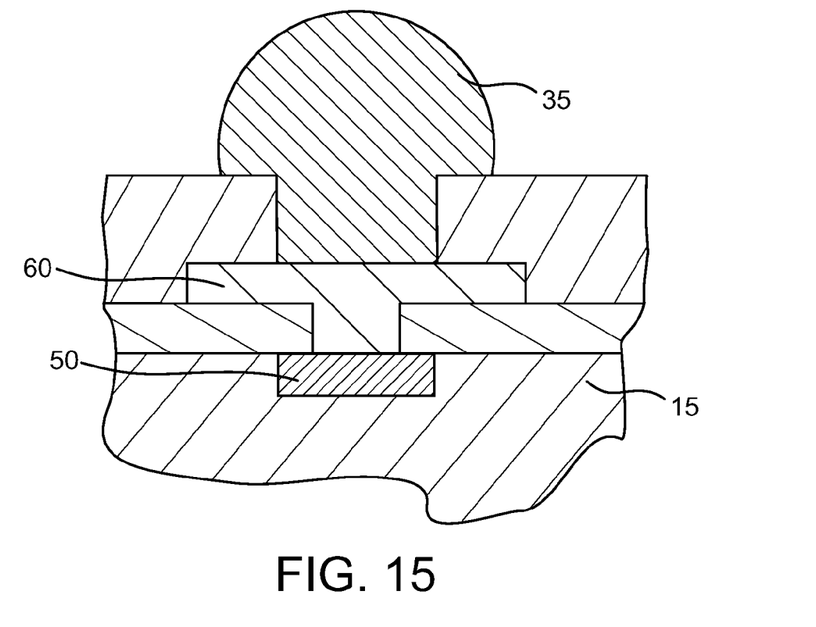
FIG. 15 is a sectional view like FIG. 14, but of the reflowed solder structure.

Additional details of the solder plating process will now be described. Referring now to FIG. 13, tin 190 may be plated using the metallic film 85 as a plating bar. The tin 190 will fill the cavity 87 and opening 95 in the mask 90. The volume $V_{sn}$ of tin 190 will be given by Eq. (5). A suitable tin solution having a composition of substantially pure tin may be used to plate the tin 190. Following the plating process, the mask 90 may be removed by ashing, solvent stripping or, combinations of the two to leave the tin portion 190 exposed as shown in FIG. 14. At this stage, the portion of the metallic film lateral to the tin 190 may be etched away from the polymer film 63 by, for example, a phosphoric acid etch. In this way, only the portion of the layer 85 from point A to point B is available for diffusion into the tin 190. Next, the semiconductor chip 15 may be subjected to a reflow process to cause the metallic film 85 and in particular the portion from point A to point B to diffuse and go into solution with the tin 190 as indicated by the arrows 195. In an exemplary process, the reflow may be performed at about 230 to 250° C. for about 30 to 60 seconds. It is anticipated that the metallic film portion 85 if composed of copper, for example, will readily diffuse into the tin 190 instead of the UBM structure 60. Following the reflow, and as shown in FIG. 15, the tin 190 and the portion of the metallic film 85 between points A and B merge into the solder bump 35. It is anticipated that the solder bump 35 will have a relatively uniform distribution of tin and copper. The bump 35 now provides an ohmic pathway through the UBM structure 60 into the underlying pad 50.

The semiconductor chip 15 may be thereafter coupled to the circuit board 20. This step may include a subsequent reflow process performed to establish solder joints between the solder bumps 25, including the solder bump 35, and the solder structures 30 depicted in FIG. 1.

Figure 16:
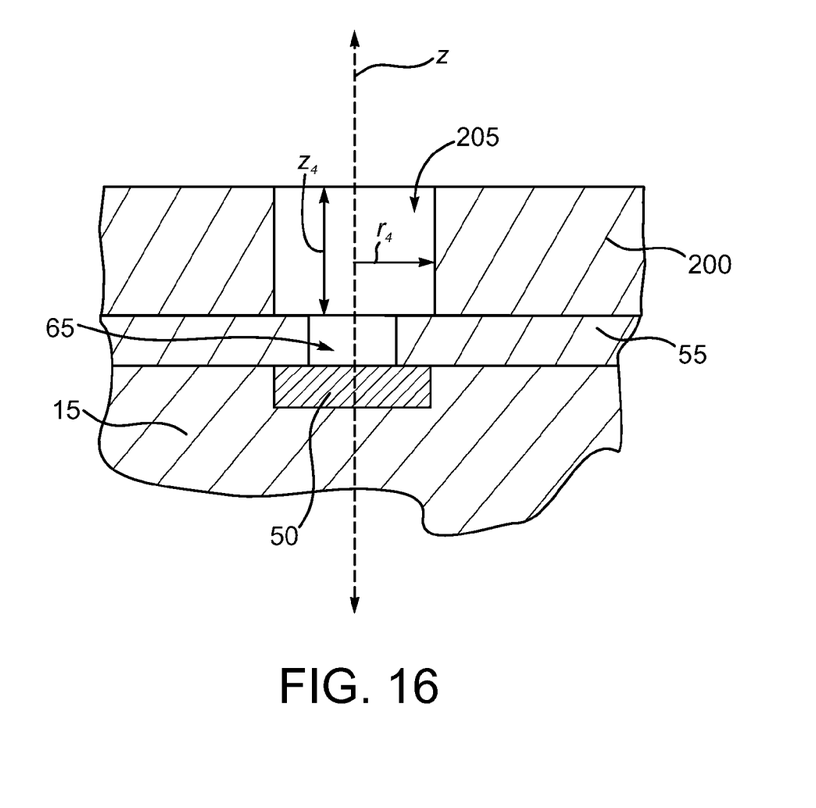
FIG. 16 is a sectional view depicting exemplary passivation structure patterning and application and patterning of a polymer layer on the passivation structure.

In the foregoing illustrative embodiment, a plated bump 35 may be fabricated using a UBM process that is more typically used for a printed bump. In the alternative embodiment to be described below, a solder bump may be fabricated using a metal deposition and subsequent plating process to form solder, but with a UBM process that is more typically tailored for a plated bump. The fabrication of the alternate UBM structure will be described in conjunction with FIGS. 16-19. Attention is turned initially to FIG. 16, which is a sectional of the semiconductor chip 15 like FIG. 3, but with a few differences. At this stage, the semiconductor chip 15 has been processed to establish the conductor pad 50, the passivation structure 55 and the opening 65 therein as described above. A polymer layer 200 is applied to the passivation structure 55 and patterned with an opening 205 aligned with the opening 65. The polymer layer 200 may be fabricated using the same materials and techniques described above in conjunction with the polymer film 63 depicted in FIG. 2. Regardless of application and/or patterning technique, the opening 205 is advantageously formed with particular dimensions. Assume for the purposes of illustration only that the opening 205 is cylindrical. Accordingly, the cylindrical coordinate system with the z-axis centered in the opening 205 will be used herein to describe certain dimensions. The opening 205 is advantageously formed with a radius $r_4$ and a depth $z_4$ relative to the z-axis. The selection of values for $r_4$ and $z_4$ will be described in conjunction with other parameters below.

Figure 17:
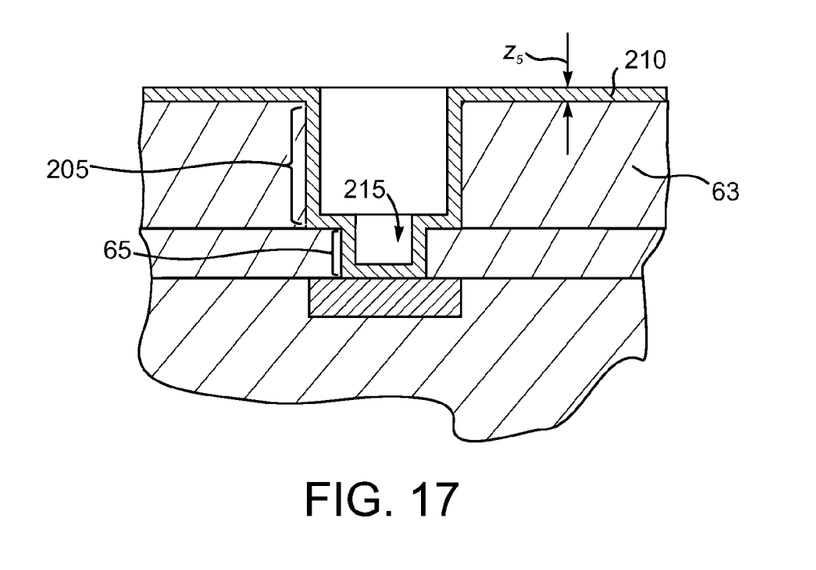
FIG. 17 is a sectional view like FIG. 16, but depicting exemplary deposition of a portion of an underbump metallization structure on the polymer layer.

Referring now to FIG. 17, a combination adhesion and seed layer, collectively labeled 210, may be sputtered or otherwise deposited in the openings 65 and 205 and on the polymer film 63. The adhesion layer component of the layer 210 may be composed of titanium, titanium-tungsten or the like. The seed layer component of the layer 210 may be composed of copper to serve as a plating bar. The layer 210 may be deposited with a thickness $z_5$ and completely fill the opening 65 in the passivation structure 55 or leave a cavity 215 as shown depending on the value of $z_5$ and the size of the opening 65.

Figure 18:
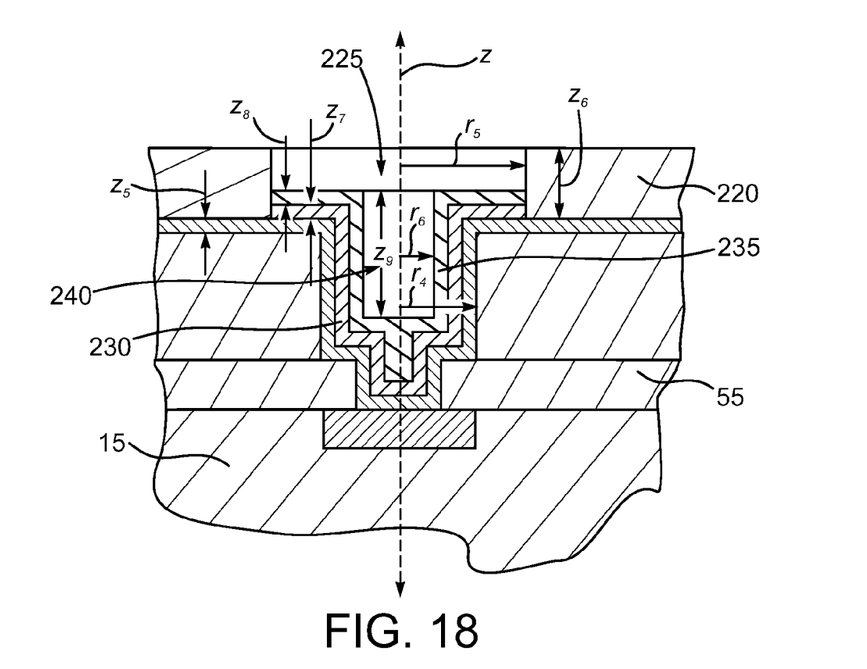
FIG. 18 is a sectional view like FIG. 17, but depicting exemplary masking and deposition of additional metallic layers, including a solder constituent.

Next and as shown in FIG. 18, a mask 220 is applied with a thickness $z_6$ to the passivation structure 55 and patterned with a suitable opening 225 that has a radius $r_5$ and depth $z_6$ relative to the z-axis. The mask 220 may be a dry film or photoresist coating applied and patterned by well-known techniques. The mask 220 is designed to constrain the subsequent plating of several layers on the layer 210. The first of these is a barrier layer 230, which is plated to the exposed portion of the layer 210. Here the seed component of the layer 210 serves as a plating bar. The barrier layer 230 may be composed of nickel, nickel vanadium, or other materials and plated to a thickness of $z_7$.

This alternative illustrative process also utilizes the deposition of successive layers of metallic material with desired volumes tailored to achieve a solder with a desired composition. When mixed during a reflow, the metallic material layers mix to form a solder with the desired composition. Still referring to FIG. 18, the first of these metallic layers, a metallic layer 235 of copper, silver or the like may be plated on the barrier layer 230 to a thickness $z_8$. The metallic layer 235 will function like the metallic layer 85 described above, and thus form a constituent of solder. Copper, silver or the like may be used. Again assuming that a tin-copper bump with about 0.7% Cu and about 99.3% tin by weight composition is desired, the metallic layer 235 may be composed of copper. Here, the plating of the metallic layer 235 may leave a cavity 240 with a radius $r_6$ and a depth $z_9$ relative to the z-axis. The cavity 240 plus the unfilled portion of the opening 225 with radius $r_5$ and a depth equal to $z_6-(z_7+z_8)$ define the volume of tin to be plated.

The volume of the metallic layer 235 available to mix with the tin may be readily computed as generally described above while taking into account the topography of the metallic layer 235. Again, it is anticipated that the quantities $r_5$, $z_5$, $z_6$, and $z_7$ will be selected based on other design considerations. With the desired solder composition and these quantities $r_5$, $z_5$, $z_6$, and $z_7$ in hand, the requisite thickness $z_8$ of the metallic layer 235 may be determined as generally described above to achieve a desired solder combination. Of course, this alternative example assumes cylindrical openings in various films and corresponding cylindrical shapes for the metallic layer 235. However, the skilled artisan will appreciate that other footprints and solder compositions may be used.

Figure 19:
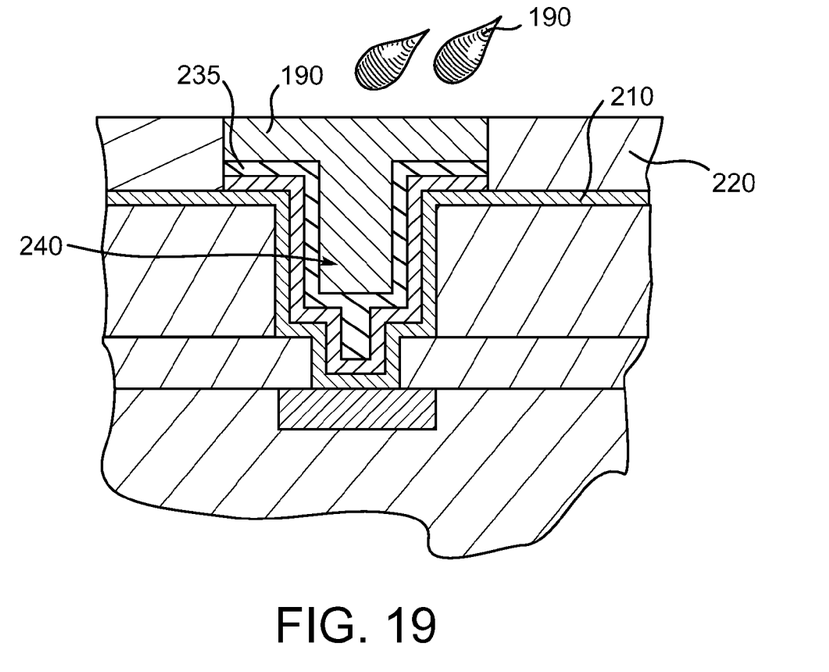
FIG. 19 is a sectional view like FIG. 18, but depicting exemplary deposition of an additional metallic material layer.
Figure 20:
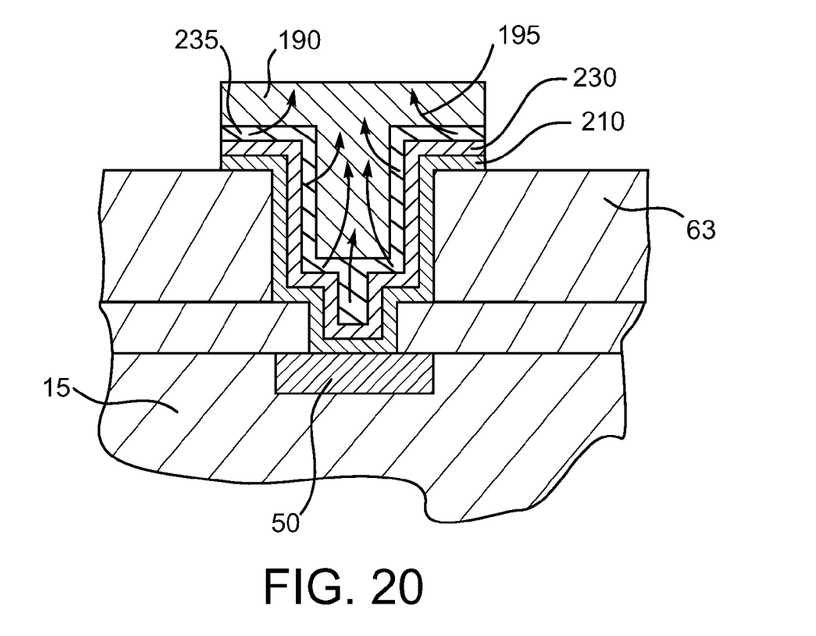
FIG. 20 is a sectional view like FIG. 19, but depicting reflow of two of the metallic material layers to form a solder structure.
Figure 21:
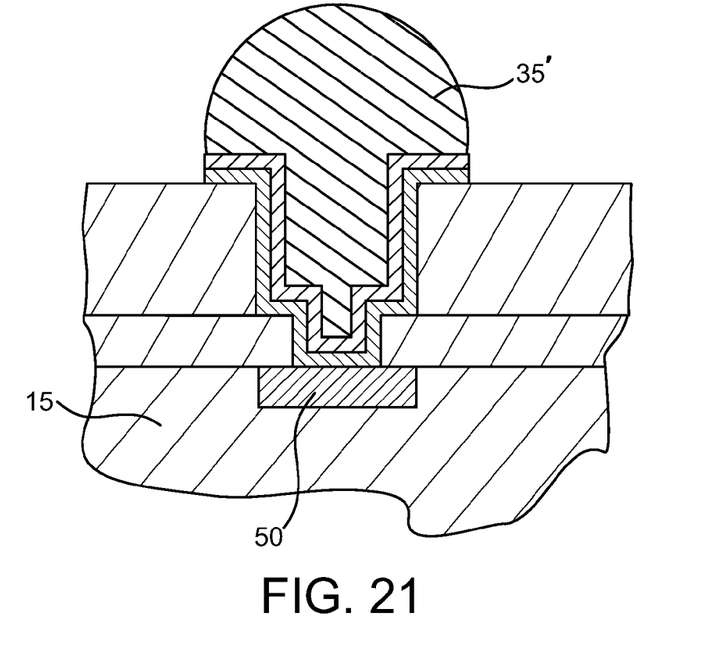
FIG. 21 is a sectional view like FIG. 20, but depicting the reflowed structure.

Additional details of the solder plating process will now be described. Referring now to FIG. 19, tin 190 may be plated using the layer 210 as a plating bar. The tin 190 will fill the cavity 240 and the remainder of the opening 225 in the mask 220. A suitable tin solution having a composition of substantially pure tin may be used to plate the tin 190. Following the plating process, the mask 220 may be removed by ashing, solvent stripping or, combinations of the two to leave the tin portion 190 exposed as shown in FIG. 20. At this stage, the portions of the adhesion/seed layer 210 lateral to the tin 190 may be etched away from the polymer film 63 by, for example, a phosphoric acid etch. In this way, only the metallic layer 235 is available for diffusion into the tin 190. Next, the semiconductor chip 15 may be subjected to a reflow process to cause the metallic film 235 to diffuse and go into solution with the tin 190 as indicated by the arrows 195. In an exemplary process, the reflow may be performed at about 230 to 250° C. for about 30 to 60 seconds. It is anticipated that the metallic film 235 if composed of copper, for example, will readily diffuse into the tin 195 instead of the barrier film 230. Following the reflow, and as shown in FIG. 20, the tin 190 and the metallic film 235 shown in FIG. 19 merge into the solder bump 35'. It is anticipated that the solder bump 35' will have a relatively uniform distribution of tin and copper. The bump 35' now provides an ohmic pathway through the UBM structure 60 into the underlying pad 50.

The semiconductor chip 15 may be thereafter coupled to the circuit board 20 shown in FIGS. 1 and 2. This step may include a subsequent reflow process performed to establish solder joints between the solder bumps 25, including the solder bump 35', and the solder structures 30 depicted in FIG. 1.

Figure 22:
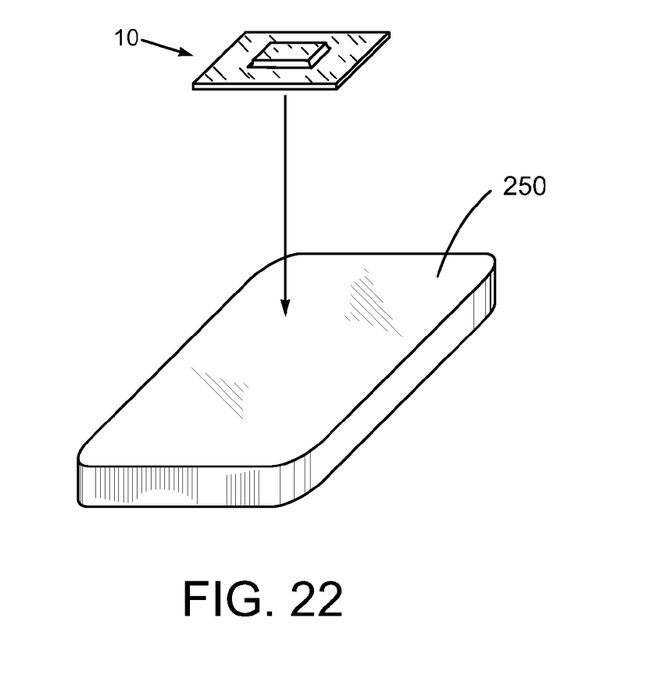
FIG. 22 is a pictorial view of an electronic device with an exemplary semiconductor chip device exploded therefrom.

As shown in FIG. 22, the semiconductor chip device 10 may be coupled to or otherwise mounted in an electronic device 250. The electronic device 250 may be a computer, a digital television, a handheld mobile device, a personal computer, a server, a memory device, an add-in board such as a graphics card, or any other computing device employing semiconductors.

Referring again to FIGS. 1 and 2, the solder interconnect structures disclosed herein are not dependent on particular functionalities of either the semiconductor chip 15 or the circuit board 20. Thus, the semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 15 may be constructed of bulk semiconductor, such as silicon or germanium, or semiconductor on insulator materials, such as silicon-on-insulator materials. The semiconductor chip 15 may be flip-chip mounted to the circuit board 20 and electrically connected thereto by solder joints or other structures (not visible in FIG. 1 but shown in subsequent figures).

The circuit board 20 may be a semiconductor chip package substrate, a circuit card, or virtually any other type of printed circuit board. Although a monolithic structure could be used for the circuit board 20, a more typical configuration will utilize a build-up design. In this regard, the circuit board 20 may consist of a central core upon which one or more build-up layers are formed and below which an additional one or more build-up layers are formed. The core itself may consist of a stack of one or more layers. One example of such an arrangement may be termed a so called "2-2-2" arrangement where a single-layer core is laminated between two sets of two build-up layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures in order to provide power, ground and signals transfers between the semiconductor chip 15 and another circuit device that is not shown. To facilitate those transfers, the circuit board 20 may be provided with input/outputs in the form of a pin grid array, a ball grid array, a land grid array or other type of interconnect scheme.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
a semiconductor chip including a layer of copper, the copper layer having a first preselected volume; and
a layer of a metallic material on the copper layer, the layer of metallic material having a second preselected volume, the first and second metallic materials operable to convert into a solder bump upon reflow with a desired ratio of copper to the layer of metallic material, the desired ratio being based on the first preselected volume and the second preselected volume.

2. The apparatus of claim 1, wherein the solder bump is substantially lead-free.

3. The apparatus of claim 1, comprising a circuit board coupled to the semiconductor chip.

4. The apparatus of claim 1, wherein the metallic material is substantially lead-free.

5. The apparatus of claim 1, comprising an underbump metallization structure on the semiconductor chip and in ohmic contact with the copper layer and a polymer layer over the underbump metallization structure.

6. The apparatus of claim 1, comprising a polymer layer on the semiconductor chip and an underbump metallization structure at least partially over the polymer layer and in ohmic contact with the copper layer.

7. The apparatus of claim 1, comprising an electronic device coupled to the semiconductor chip.

8. The apparatus of claim 1, comprising a circuit board coupled to the semiconductor chip.

9. The apparatus of claim 8, wherein the circuit board comprises a semiconductor chip package substrate.

10. An apparatus, comprising:
    a semiconductor chip including solder bump; and
    whereby the solder bump being formed by depositing a layer of copper on the semiconductor chip, the copper layer having a first preselected volume, depositing a layer of a metallic material on the copper layer, the layer of metallic material having a second preselected volume, and reflowing the copper layer and the layer of metallic material to convert them into a solder bump with a desired ratio of copper to the layer of metallic material, the desired ratio being based on the first preselected volume and the second preselected volume.

11. The apparatus of claim 10, wherein the solder bump is substantially lead-free.

12. The apparatus of claim 10, wherein the copper layer is deposited by sputtering.

13. The apparatus of claim 10, wherein the layer of the metallic material is deposited by plating.

14. The apparatus of claim 10, comprising a polymer layer on the semiconductor chip with a first opening, at least a portion of the copper layer being in the first opening.

15. The apparatus of claim 10, comprising an underbump metallization structure on the semiconductor chip below the copper layer and a polymer layer over the underbump metallization structure.

16. The apparatus of claim 10, comprising a polymer layer on the semiconductor chip and an underbump metallization on the semiconductor chip, the underbump metallization structure being at least partially over the polymer layer.

17. The apparatus of claim 10, comprising a circuit board coupled to the semiconductor chip.

18. The apparatus of claim 17, wherein the circuit board comprises a semiconductor chip package substrate.

19. An apparatus, comprising:
    a semiconductor chip including a layer of copper, the copper layer having a first preselected volume; and
    a layer of tin on the copper layer, the layer of tin having a second preselected volume, the copper layer and the tin layer being operable to convert into a solder bump upon reflow with a desired ratio of copper to tin, the desired ratio being based on the first preselected volume and the second preselected volume.

20. The apparatus of claim 19, comprising a polymer layer on the semiconductor chip and an underbump metallization on the semiconductor chip, the underbump metallization structure being at least partially over the polymer layer.

* * * * *